United States Patent
JangJian et al.

(10) Patent No.: US 9,941,376 B2
(45) Date of Patent: Apr. 10, 2018

(54) METAL GATE SCHEME FOR DEVICE AND METHODS OF FORMING

(71) Applicant: Taiwan Semiconductor Manufacturing Company, Ltd., Hsin-Chu (TW)

(72) Inventors: Shiu-Ko JangJian, Tainan (TW); Chi-Wen Liu, Hsin-Chu (TW); Chih-Nan Wu, Tainan (TW); Chun Che Lin, Tainan (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/730,444

(22) Filed: Jun. 4, 2015

(65) Prior Publication Data
US 2016/0322471 A1 Nov. 3, 2016

Related U.S. Application Data

(60) Provisional application No. 62/155,278, filed on Apr. 30, 2015.

(51) Int. Cl.
*H01L 21/70* (2006.01)
*H01L 29/49* (2006.01)
(Continued)

(52) U.S. Cl.
CPC .... *H01L 29/4966* (2013.01); *H01L 21/28088* (2013.01); *H01L 21/823842* (2013.01);
(Continued)

(58) Field of Classification Search
CPC .......... H01L 29/4966; H01L 29/66636; H01L 29/7834; H01L 21/28088; H01L 29/66545; H01L 29/165; H01L 29/7848
See application file for complete search history.

(56) References Cited

U.S. PATENT DOCUMENTS 4,996,116 A * 2/1991 Webster ................ B32B 15/018
428/627
8,586,436 B2 11/2013 Ng et al.
(Continued)

FOREIGN PATENT DOCUMENTS

| CN | 101950756 A | 1/2011 |
|---|---|---|
| JP | 2014146789 A | 8/2014 |

(Continued)

*Primary Examiner* — Stephen W Smoot
*Assistant Examiner* — Vicki B Booker
(74) *Attorney, Agent, or Firm* — Slater Matsil, LLP

(57) ABSTRACT

Gate structures and methods of forming the gate structures are described. In some embodiments, a method includes forming source/drain regions in a substrate, and forming a gate structure between the source/drain regions. The gate structure includes a gate dielectric layer over the substrate, a work function tuning layer over the gate dielectric layer, a first metal over the work function tuning layer, an adhesion layer over the first metal, and a second metal over the adhesion layer. In some embodiments, the adhesion layer can include an alloy of the first and second metals, and may be formed by annealing the first and second metals. In other embodiments, the adhesion layer can include an oxide of at least one of the first and/or second metal, and may be formed at least in part by exposing the first metal to an oxygen-containing plasma or to a natural environment.

20 Claims, 8 Drawing Sheets

(51) Int. Cl.
  *H01L 29/66* (2006.01)
  *H01L 21/28* (2006.01)
  *H01L 29/78* (2006.01)
  *H01L 21/8238* (2006.01)
  *H01L 29/165* (2006.01)

(52) U.S. Cl.
  CPC .. *H01L 29/66545* (2013.01); *H01L 29/66636* (2013.01); *H01L 29/7834* (2013.01); *H01L 29/165* (2013.01); *H01L 29/7848* (2013.01)

(56) References Cited

U.S. PATENT DOCUMENTS

| | | |
|---|---|---|
| 2004/0063275 A1 | 4/2004 | Kim et al. |
| 2005/0051854 A1 | 3/2005 | Cabral, Jr. et al. |
| 2010/0006928 A1* | 1/2010 | Pan ............... H01L 29/407 257/330 |
| 2011/0006354 A1 | 1/2011 | Jangjian et al. |
| 2011/0121399 A1 | 5/2011 | Park et al. |
| 2011/0227161 A1 | 9/2011 | Zhu et al. |
| 2011/0230042 A1 | 9/2011 | Chew et al. |
| 2014/0187039 A1 | 7/2014 | Kauerauf et al. |
| 2014/0299939 A1* | 10/2014 | Kim ............... H01L 21/02697 257/369 |
| 2015/0311208 A1 | 10/2015 | Kim |

FOREIGN PATENT DOCUMENTS

| | | |
|---|---|---|
| KR | 20020068569 A | 8/2002 |
| KR | 20020094461 A | 12/2002 |
| KR | 20140121634 A | 10/2014 |
| TW | 201349310 A | 12/2013 |

\* cited by examiner

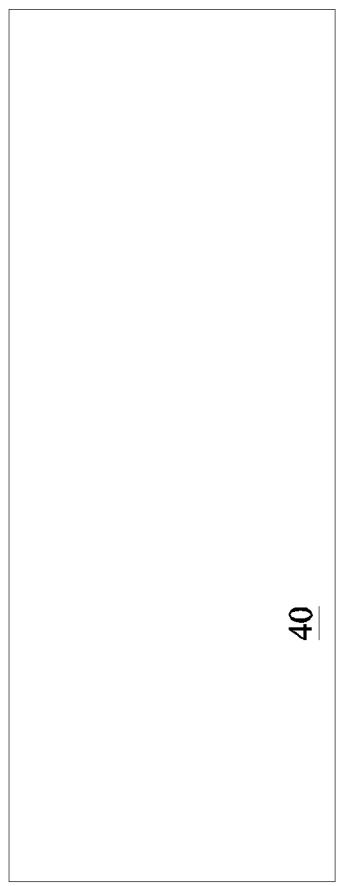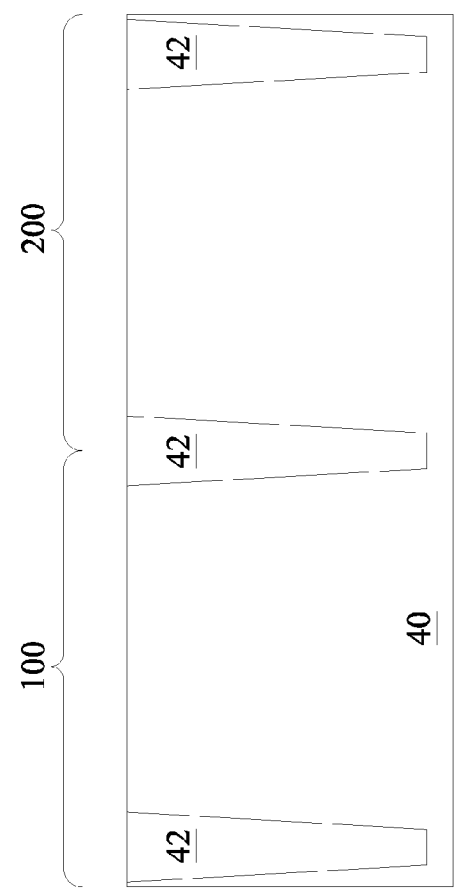

METAL GATE SCHEME FOR DEVICE AND METHODS OF FORMING

This application claims priority to and the benefit of U.S. Provisional Application No. 62/155,278, filed on Apr. 30, 2015, entitled "Metal Gate Scheme for Device and Methods of Forming," which application is hereby incorporated herein by reference in its entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Transistors are circuit components or elements that are often formed on semiconductor devices. Many transistors may be formed on a semiconductor device in addition to capacitors, inductors, resistors, diodes, conductive lines, or other elements, depending on the circuit design. A field effect transistor (FET) is one type of transistor.

Generally in conventional structures, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 8 are cross-sectional views of intermediate stages in the manufacturing of complementary Field-Effect Transistors (FETs) in accordance with some embodiments.

DETAILED DESCRIPTION

Figure 3:
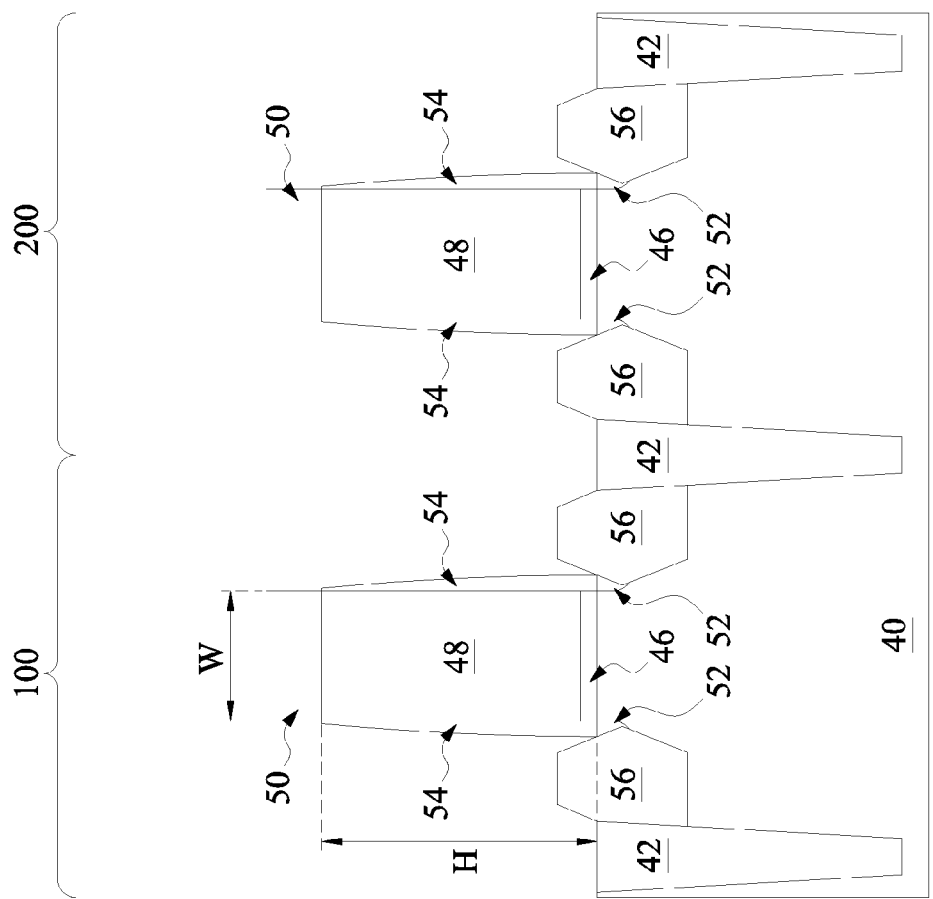

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Field-Effect Transistors (FETs) and methods of forming the same are provided in accordance with various embodiments. Intermediate stages of forming FETs are illustrated. Some embodiments discussed herein are discussed in the context of planar FETs formed using a gate-last process. Some embodiments contemplate aspects used in other devices, such as finFETs. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

FIGS. 1 through 8 are cross-sectional views of intermediate stages in the manufacturing of complementary FETs in accordance with an exemplary embodiment. FIG. 1 illustrates a substrate 40. The substrate 40 may be a semiconductor substrate, such as a bulk semiconductor substrate, a semiconductor-on-insulator (SOI) substrate, a multi-layered or gradient substrate, or the like. The substrate 40 may include a semiconductor material, such as an elemental semiconductor including Si and Ge; a compound or alloy semiconductor including SiC, SiGe, GaAs, GaP, GaAsP, AlInAs, AlGaAs, GaInAs, InAs, GaInP, InP, InSb, and/or GaInAsP; or a combination thereof. The substrate 40 may be doped or un-doped. In a specific example, the substrate 40 is a bulk silicon substrate.

FIG. 2 illustrates the formation of isolation regions 42, such as Shallow Trench Isolation (STI) regions, in the substrate 40, such as between a first region 100 and a second region 200. In some embodiments to form the isolation regions 42, trenches are formed in the substrate 40 by etching. The etching may be any acceptable etch process, such as a reactive ion etch (RIE), neutral beam etch (NBE), the like, or a combination thereof. The etch may be anisotropic. An insulation material is formed in the trenches. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. Further in FIG. 2, a planarization process, such as a chemical mechanical polish (CMP), may remove any excess insulation material and form top surfaces of the isolation regions 42 and a top surface of the substrate 40 that are co-planar.

Although not specifically illustrated, appropriate wells may be formed in the substrate 40. For example, a p-well may be formed in the first region 100 of the substrate 40 where an n-type device, such as an n-type FET, is to be formed, and an n-well may be formed in the second region 200 of the substrate 40 where a p-type device, such as a p-type FET, is to be formed.

For example, to form a p-well in the first region 100, a photoresist can formed over the second region 200 of the substrate 40. The photoresist can be patterned to expose the first region 100 of the substrate 40. The photoresist can be formed by using a spin-on technique and can be patterned using acceptable photolithography techniques. Once the photoresist is patterned, a p-type impurity implant can be performed in the first region 100, and the photoresist may act as a mask to substantially prevent p-type impurities from being implanted into the substrate 40 in the second region 200. The p-type impurities may be boron, $BF_2$, or the like implanted in the substrate 40 the first region 100 to a concentration of equal to or less than $10^{18}$ $cm^{-3}$, such as between about $10^{17}$ $cm^{-3}$ and about $10^{18}$ $cm^{-3}$. After the implant, the photoresist can be removed, such as by an acceptable ashing process.

Further, to form an n-well in the second region 200, a photoresist can be formed over the first region 100 of the substrate 40. The photoresist can be patterned to expose the second region 200 of the substrate 40. The photoresist can be formed by using a spin-on technique and can be patterned using acceptable photolithography techniques. Once the photoresist is patterned, an n-type impurity implant can be performed in the second region 200, and the photoresist may act as a mask to substantially prevent n-type impurities from being implanted into the substrate 40 in the first region 100. The n-type impurities may be phosphorus, arsenic, or the like implanted in the substrate 40 in the second region 200 to a concentration of equal to or less than $10^{18}$ $cm^{-3}$, such as between about $10^{17}$ $cm^{-3}$ and about $10^{18}$ $cm^{-3}$. After the implant, the photoresist can be removed, such as by an acceptable ashing process. After the implants, an anneal may be performed to activate the p-type and n-type impurities that were implanted. The implantations may form a p-well in the substrate 40 in the first region 100 and an n-well in the substrate 40 in the second region 200.

In FIG. 3, a dummy dielectric layer is formed on the substrate 40. The dummy dielectric layer may be, for example, silicon oxide, silicon nitride, a combination thereof, or the like, and may be deposited or thermally grown according to acceptable techniques, such as CVD, thermal oxidation, or the like. A dummy gate layer is formed over the dummy dielectric layer. The dummy gate layer may be deposited, such as by using CVD or the like, over the dummy dielectric layer and then planarized, such as by a CMP. The dummy gate layer may comprise, for example, polysilicon, although other materials that have a high etching selectivity may also be used. A mask layer is then formed over the dummy gate layer. The mask layer may be deposited, such as by using CVD or the like, over the dummy gate layer. The mask layer may comprise, for example, silicon nitride, silicon oxynitride, silicon carbon nitride, or the like.

The mask layer may be patterned using acceptable photolithography and etching techniques to form masks 50. The pattern of the masks 50 then may be transferred to the dummy gate layer and dummy dielectric layer by an acceptable etching technique to form dummy gates 48 and dummy gate dielectrics 46 from the dummy gate layer and the dummy dielectric layer, respectively. The etching may comprise an acceptable anisotropic etching, such as RIE, NBE, or the like. A width W of the dummy gates 48 and dummy gate dielectrics 46 can be in range from about 10 nm to about 240 nm, such as about 20 nm. Each stack of a dummy gate 48 and a dummy gate dielectric 46 has a combined height H. The height H can be in range from about 20 nm to about 80 nm, such as about 40 nm. An aspect ratio of the height H to width W can be in a range from about 0.1 to about 8, such as about 5. The dummy gates 48 cover respective channel regions in the substrate 40.

Implants for lightly doped source/drain (LDD) regions 52 may be performed. Similar to the implants discussed above, a mask, such as a photoresist, may be formed over the second region 200, e.g., for a p-type device, while exposing the first region 100, e.g., for an n-type device, and n-type impurities may be implanted into the exposed substrate 40 in the first region 100. The mask may then be removed. Subsequently, a mask, such as a photoresist, may be formed over the first region 100 while exposing the second region 200, and p-type impurities may be implanted into the exposed substrate 40 in the second region 200. The mask may then be removed. The n-type impurities may be the any of the n-type impurities previously discussed, and the p-type impurities may be the any of the p-type impurities previously discussed. The lightly doped source/drain regions 52 may have a concentration of impurities from about $10^{15}$ $cm^{-3}$ to about $10^{16}$ $cm^{-3}$. An anneal may be used to activate the implanted impurities.

Gate spacers 54 are formed along sidewalls of the dummy gates 48 and dummy gate dielectrics 46. The gate spacers 54 may be formed by conformally depositing, such as by CVD or the like, a material and subsequently anisotropically etching the material. The material of the gate spacers 54 may be silicon nitride, silicon carbon nitride, a combination thereof, or the like.

Further in FIG. 3, epitaxial source/drain regions 56 are formed in the substrate 40. A hardmask layer may be formed in the second region 200 while the substrate 40 in the first region 100 remains exposed. The hardmask layer can be silicon nitride, silicon carbon nitride, silicon oxynitride, silicon carbon oxynitride, the like, or a combination thereof deposited by CVD or the like. Other materials and methods of forming the hardmask layer may be used. The hardmask layer may be patterned to expose the first region 100 using any acceptable photolithography and etching process, such as RIE, NBE, or the like. With the first region 100 exposed and the second region 200 masked, an etch selective to the substrate 40 in the first region 100 is performed. The etch can be any acceptable etch, such as a dry or wet etch, which may be anisotropic or isotropic. The etch recesses source/drain regions in the first region 100. The epitaxial source/drain regions 56 are then epitaxially grown in the recesses in the first region 100. The epitaxial growth may be by using Metal-Organic Chemical Vapor Deposition (MOCVD), Molecular Beam Epitaxy (MBE), Liquid Phase Epitaxy (LPE), Vapor Phase Epitaxy (VPE), the like, or a combination thereof. The epitaxial source/drain regions 56 in the first region 100 may comprise any acceptable material, such as appropriate for the device type, e.g., n-type. For example, the epitaxial source/drain regions 56 for an n-type device may comprise silicon, SiC, SiCP, SiP, or the like. Then, the hardmask layer may be removed from the second region 200, for example, using an etch selective to the material of the hardmask layer.

Another hardmask layer may be formed in the first region 100 while the substrate 40 in the second region 200 remains exposed. The hardmask layer can be silicon nitride, silicon carbon nitride, silicon oxynitride, silicon carbon oxynitride, the like, or a combination thereof deposited by CVD or the like. Other materials and methods of forming the hardmask layer may be used. The hardmask layer may be patterned to expose the second region 200 using any acceptable photolithography and etching process, such as RIE, NBE, or the like. With the second region 200 exposed and the first region 100 masked, an etch selective to the substrate 40 in the second region 200 is performed. The etch can be any acceptable etch, such as a dry or wet etch, which may be anisotropic or isotropic. The etch recesses source/drain regions in the second region 200. The epitaxial source/drain regions 56 are then epitaxially grown in the recesses in the second region 200. The epitaxial growth may be by using MOCVD, MBE, LPE, VPE, the like, or a combination thereof. The epitaxial source/drain regions 56 in the second region 200 may comprise any acceptable material, such as appropriate for the device type, e.g., p-type. For example, the epitaxial source/drain regions 56 for a p-type device may comprise SiGe, SiGeB, Ge, GeSn, or the like. Then, the hardmask layer may be removed from the first region 100, for example, using an etch selective to the material of the hardmask layer.

The epitaxial source/drain regions 56 may be implanted with dopants, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type impurities for source/drain regions for an n-type device in the first region 100 may be any of the n-type impurities previously discussed, and the p-type impurities for source/drain regions in for the p-type device in the second region 200 may be any of the p-type impurities previously discussed. In other embodiments, the epitaxial source/drain regions 56 may be in situ doped during growth.

Figure 4:
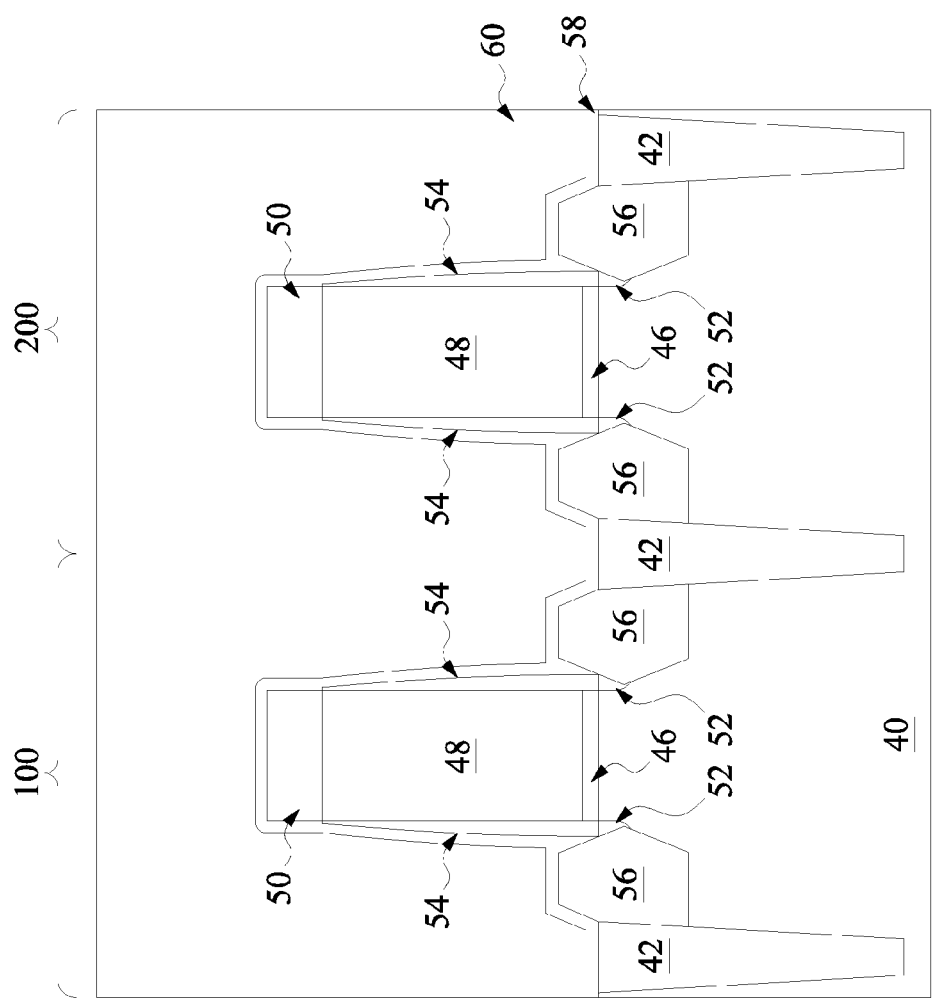

In FIG. 4, an etch stop layer (ESL) 58 is conformally formed on the epitaxial source/drain regions 56, gate spacers 54, masks 50, and isolation regions 42. In some embodiments, the ESL 58 may comprise silicon nitride, silicon carbon nitride, or the like, formed using Atomic Layer Deposition (ALD), CVD, the like, or a combination thereof. A bottom inter-layer dielectric (ILD0) 60 is deposited over the ESL 58. ILD0 60 may comprise Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, plasma-enhanced CVD (PECVD), FCVD, the like, or a combination thereof.

Figure 5:
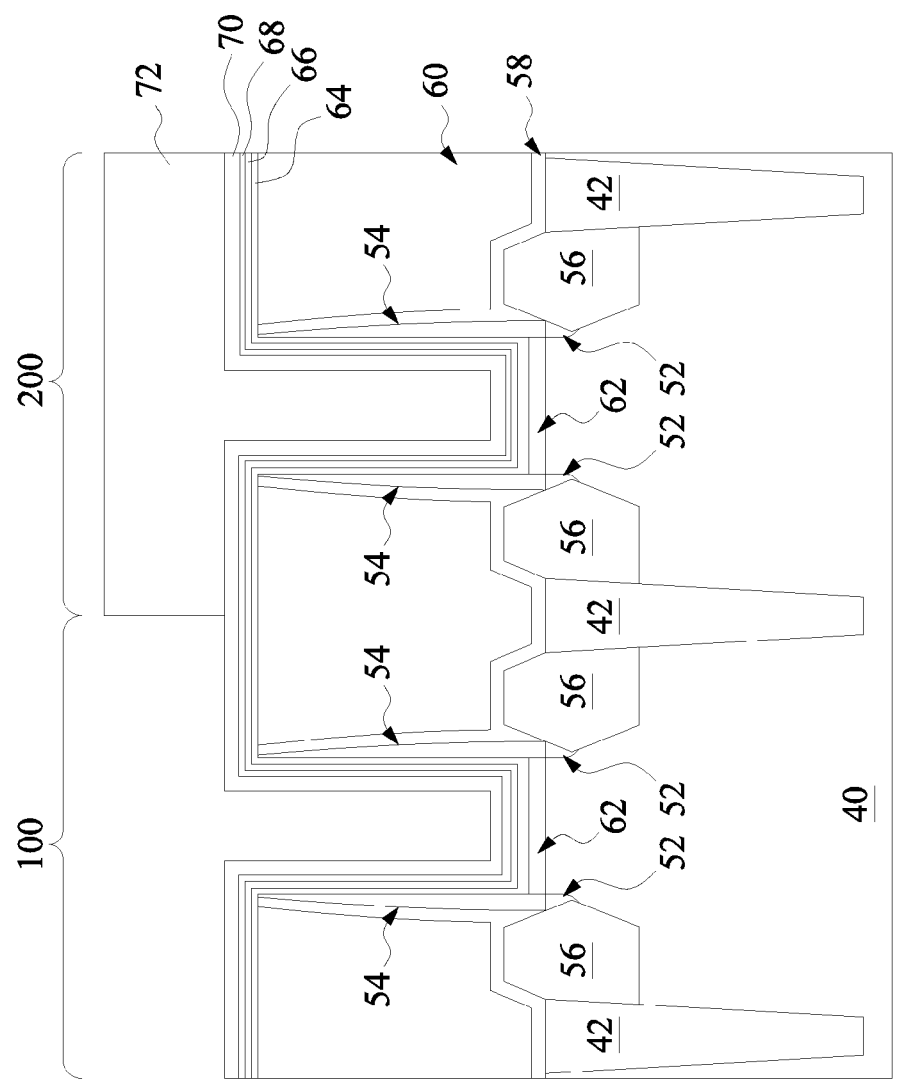

In FIG. 5, a planarization process, such as a CMP, is performed to level the top surface of ILD0 60 with the top surfaces of the dummy gates 48. The CMP may also remove the masks 50 and the ESL 58 from over the dummy gates 48. Accordingly, top surfaces of the dummy gates 48 are exposed through the ILD0 60. The dummy gates 48 and the dummy gate dielectrics 46 are removed in an etching step(s), so that openings through the ILD0 60 and defined by the gate spacers 54 are formed to the substrate 40. Each of the openings may have an aspect ratio corresponding to the width W and height H discussed above with respect to FIG. 3 since the openings are defined by the removal of the dummy gates 48 and dummy gate dielectrics 46. Each opening exposes a channel region in a respective active area in the regions 100 and 200 of the substrate 40. Each channel region is disposed between a corresponding pair of epitaxial source/drain regions 56. The etching step(s) may be selective to the materials of the dummy gates 48 and the dummy gate dielectrics 46, which etching may be a dry or wet etching. During the etching, the dummy gate dielectrics 46 may be used as an etch stop layer when the dummy gates 48 are etched. The dummy gate dielectric 46 may then be etched after the removal of the dummy gates 48. Although not specifically illustrated, depending on the similarity of materials used for the ILD0 60 and the dummy gate dielectrics 46, the ILD0 60 may be recessed when the dummy gate dielectrics 46 are removed, and this recessing may cause portions of the ESL 58 and/or gate spacers 54 to protrude above the top surface of the ILD0 60.

An interfacial dielectric 62 is formed in each opening and on the substrate 40. The interfacial dielectric 62 may be, for example, an oxide or the like formed by thermal oxidation or the like. A thickness of the interfacial dielectric 62 may be in a range from about 5 Å to about 50 Å, such as about 10 Å. A gate dielectric layer 64 is then formed conformally on the top surface of the ILD0 60 and in the openings along sidewalls of the gate spacers 54 and on the interfacial dielectric 62. In some embodiments, the gate dielectric layer 64 comprises a high-k dielectric material, and in these embodiments, the gate dielectric layer 64 may have a k value greater than about 7.0, and may include a metal oxide or a silicate of Hf, Al, Zr, La, Mg, Ba, Ti, Pb, and combinations thereof. The formation methods of gate dielectric layer 64 may include ALD, CVD, Molecular-Beam Deposition (MBD), the like, or a combination thereof. A thickness of the gate dielectric layer 64 may be in a range from about 5 Å to about 50 Å, such as about 15 Å.

A capping layer is then formed conformally on the gate dielectric layer 64. In the illustrated embodiment, the capping layer comprises a first sub-layer 66 and a second sub-layer 68. In some embodiments, the capping layer may be a single layer or may comprise additional sub-layers. The capping layer may function as a barrier layer to prevent a subsequently deposited metal-containing material from diffusing into the gate dielectric layer 64. Further, the second sub-layer 68, as illustrated, can function as an etch stop during the formation of a work function tuning layer in regions 100 and 200 if the first sub-layer 66 is formed from a same material as the work function tuning layer, as will become clearer subsequently. The first sub-layer 66 can comprise titanium nitride (TiN) or the like deposited conformally on the gate dielectric layer 64 by ALD, CVD, or the like. The second sub-layer 68 can comprise tantalum nitride (TaN) or the like deposited conformally on the first sub-layer 66 by ALD, CVD, or the like. A thickness of the capping layer may be in a range from about 10 Å to about 50 Å, such as about 20 Å. In the illustrated embodiment, a thickness of the first sub-layer 66 may be in a range from about 10 Å to about 50 Å, such as about 15 Å, and a thickness of the second sub-layer 68 may be in a range from about 10 Å to about 50 Å, such as about 15 Å.

A first work function tuning layer 70 is then formed conformally on the capping layer, e.g., on the second sub-layer 68. The first work function tuning layer 70 may be any acceptable material with any acceptable thickness to tune a work function of a device, such as a p-type device, to a desired amount given the application of the device to be formed, and may be deposited using any acceptable deposition process. In some embodiments, the first work function tuning layer 70 comprises titanium nitride (TiN) or the like deposited by ALD, CVD, or the like. A thickness of the first work function tuning layer 70 may be in a range from about 20 Å to about 100 Å, such as about 50 Å.

Figure 6:
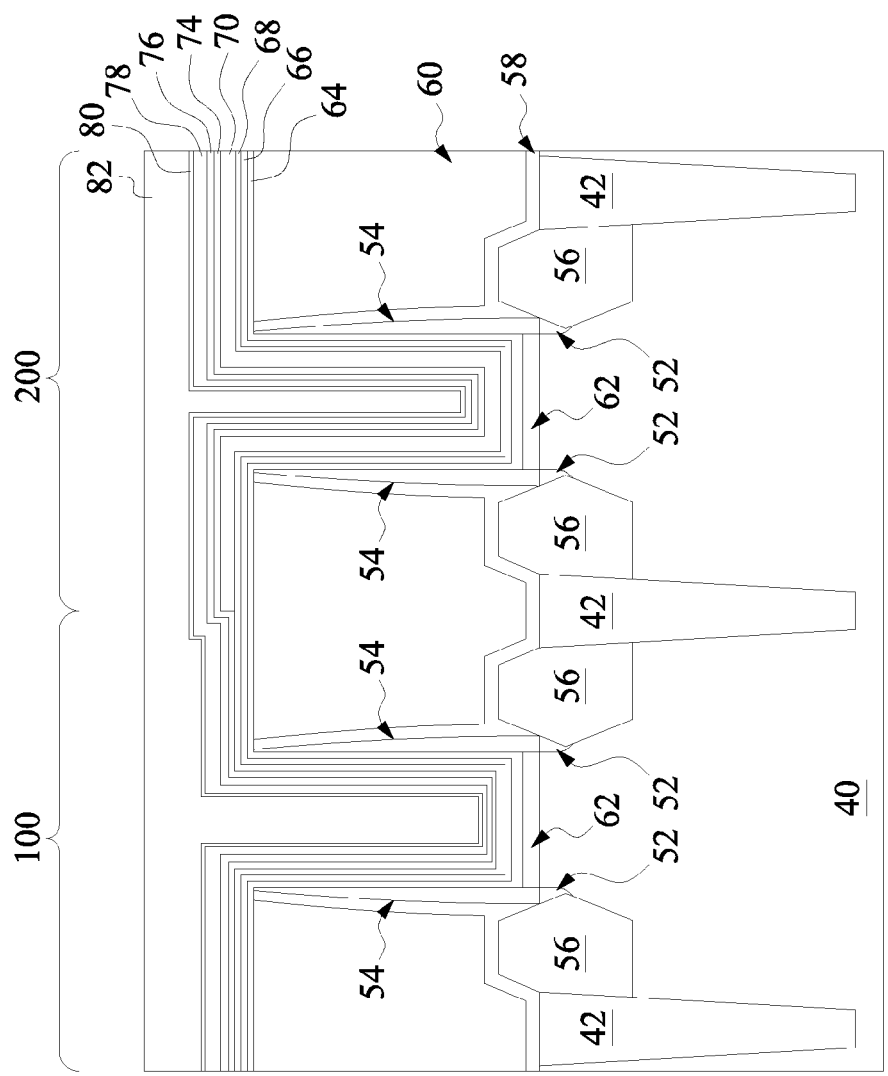

A mask 72 is then patterned over the first work function tuning layer 70 in the second region 200, while the first work function tuning layer 70 in the first region 100 is exposed. In some embodiments, the mask 72 is a photoresist, which can be formed over the second region 200. The photoresist can be patterned to expose the first region 100. The photoresist can be formed by using a spin-on technique and can be patterned using acceptable photolithography techniques. Once the mask 72 is patterned, an etch selective to the first work function tuning layer 70 is performed to remove the first work function tuning layer 70 from the first region 100, as illustrated in FIG. 6. The second sub-layer 68 in the first region 100 may act as an etch stop during this etching. The mask 72 is then removed, such as by using an appropriate ashing processing if the mask 72 is a photoresist.

Further in FIG. 6, a second work function tuning layer 74 is then formed conformally on the capping layer, e.g., on the second sub-layer 68, in the first region 100, and conformally on the first work function tuning layer 70 in the second region 200. The second work function tuning layer 74 may be any acceptable material with any acceptable thickness to tune a work function of a device to a desired amount given the application of the device to be formed, and may be deposited using any acceptable deposition process. In some embodiments, the second work function tuning layer 74 comprises titanium aluminum (TiAl) or the like deposited by ALD, CVD, or the like. A thickness of the second work function tuning layer 74 may be in a range from about 20 Å to about 80 Å, such as about 40 Å.

A barrier layer 76 is then formed conformally on the second work function tuning layer 74 in the first region 100 and the second region 200. The barrier layer 76 may be any acceptable material to prevent a subsequently deposited metal-containing material from diffusing into an underlying layer, and may also function as a further work function tuning layer. The barrier layer 76 may be deposited using any acceptable deposition process. In some embodiments, the barrier layer 76 comprises titanium nitride (TiN) or the like deposited by ALD, CVD, or the like. A thickness of the barrier layer 76 may be in a range from about 20 Å to about 100 Å, such as about 60 Å.

A layer of a first metal 78 is then formed conformally on the barrier layer 76 in the first region 100 and the second region 200. The layer of a first metal 78 may be any acceptable metal, and may be deposited using any acceptable deposition process. In some embodiments, the layer of a first metal 78 is cobalt (Co) or the like deposited by physical vapor deposition (PVD), ALD, CVD, or the like. A thickness of the layer of the first metal 78 may be in a range from about 10 Å to about 50 Å, such as about 20 Å.

An adhesion layer 80 is formed conformally on the layer of the first metal 78 in the first region 100 and the second region 200. Example adhesion layers and methods of forming the adhesion layers are discussed subsequently.

A second metal 82 is formed on the adhesion layer 80 in the first region 100 and the second region 200. In some embodiments, the second metal 82 is a metal different from the first metal 78. The second metal 82 may be any acceptable metal, and may be deposited using any acceptable deposition process. In some embodiments, the second metal 82 is aluminum or the like deposited by PVD, CVD, or the like. The deposition of the second metal 82 can be performed in situ after the deposition of the first metal 78. The second metal 82 fills the unfilled portions of the openings.

Referring back to the adhesion layer 80, in some embodiments, the adhesion layer 80 is an oxide layer. The oxide layer, for example, may be an oxide of the first metal 78, may comprise a first sub-layer of an oxide of the first metal 78 and a second sub-layer of an oxide of the second metal 82, or may be an oxide of a mixture of the first metal 78 and the second metal 82. For example, when the first metal 78 is cobalt (Co) and the second metal 82 is aluminum (Al), the oxide layer can be $CoO_x$, can comprise a sub-layer of $CoO_x$ and a sub-layer of $AlO_y$, or can be $CoAl_yO_z$. The oxide layer can be formed by using a thermal oxidation, an oxygen-containing plasma treatment, or the like after depositing the first metal 78 and before depositing the second metal 82. An example of an oxygen-containing plasma treatment would be exposure to an oxygen ($O_2$) plasma or the like. The oxide layer could also be a native oxide formed by exposing the first metal 78 to a natural, outside environment, such as by breaking a vacuum after depositing the first metal 78 and before depositing the second metal 82, such as by breaking the vacuum in situ after the deposition of the first metal 78. Then, the second metal 82 can be deposited on the oxide layer. The second metal 82, in some instances, may not react with or diffuse into the oxide layer such that the oxide layer is an oxide of the first metal 78. In other instances, the second metal 82 can react with or diffuse into the oxide layer to form respective sub-layers of an oxide of the first metal 78 and another oxide of the second metal 82, or to form an oxide of a mixture of the first metal 78 and the second metal 82. A thickness of the oxide layer may be in a range from about 10 Å to about 50 Å, such as about 20 Å. As an example, the oxide layer can have a density equal to or greater than 2.0 g/cm$^3$, such as in a range from about 2.0 g/cm$^3$ to about 5.0 g/cm$^3$.

In some other embodiments, the adhesion layer 80 is a metal alloy layer. The metal alloy layer can be an alloy of the first metal 78 and the second metal 82. For example, when the first metal 78 is cobalt (Co) and the second metal 82 is aluminum (Al), the metal alloy layer can be a layer of CoAl. After the first metal 78 and the second metal 82 are deposited, an anneal can be performed to diffuse and react the metals 78 and 82 at an interface therebetween to form the metal alloy layer. The anneal may be at a temperature in a range from about 200° C. to about 500° C., such as about 400° C., for a duration in a range from about 10 seconds to about 600 seconds, such as about 150 seconds. A thickness of the metal alloy layer may be in a range from about 10 Å to about 50 Å, such as about 20 Å.

Figure 7:
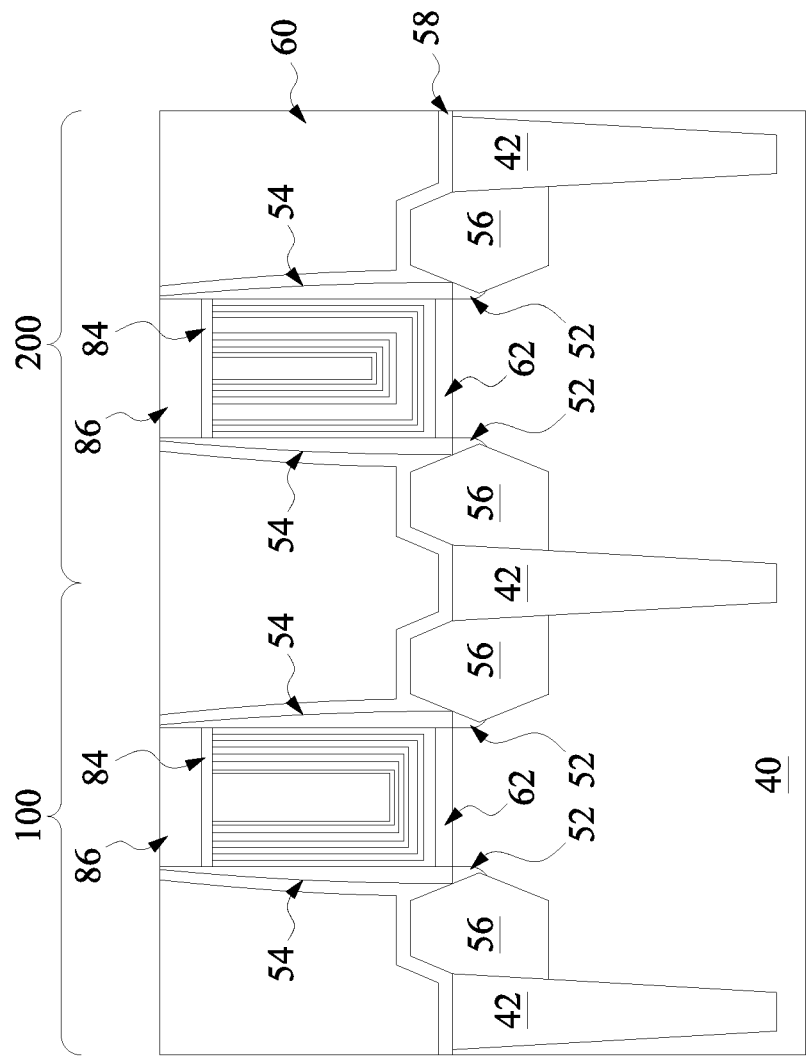

In FIG. 7, a planarization process, such as a CMP, may be performed to remove the excess portions of metals 78 and 82 and the layers 64, 66, 68, 70, 74, 76, and 80, which excess portions are over the top surface of ILD0 60. Then, a controlled etch-back selective to the metals 78 and 82 and the layers 64, 66, 68, 70, 74, 76, and 80 is performed to recess those materials, which results in the gate structures illustrated in FIG. 7, from the top surface of the ILD0 60. The etch-back may comprise an acceptable anisotropic etching, such as RIE, NBE, or the like.

Buffer layers 84 are formed on the metals 78 and 82 and the layers 64, 66, 68, 70, 74, 76, and 80. In some embodiments, the buffer layers 84 are oxide layers. The oxide layer can be formed using a thermal oxidation, an oxygen-containing plasma treatment, or the like. An example of an oxygen-containing plasma treatment would be exposure to an oxygen ($O_2$) plasma or the like. The oxide layer could also be a native oxide formed by exposing the metals 78 and 82 and the layers 64, 66, 68, 70, 74, 76, and 80 to a natural, outside environment, such as by breaking a vacuum after the etch-back. A thickness of the buffer layer 84 may be in a range from about 10 Å to about 50 Å, such as about 20 Å. The oxide layer may have a composition that corresponds to its underlying material. For example, if the second metal 82 is aluminum (Al), the oxide layer can be aluminum oxide ($AlO_x$). The oxide layer may have a varying composition proximate portions that overlie the first metal 78 and the layers 64, 66, 68, 70, 74, 76, and 80. In some embodiments, the thicknesses of these metal and layers can be small compared to the width of the second metal 82 at the oxide layer, and hence, the variance of composition can be small. The oxide layer can be substantially free from pores and/or voids and may be very dense. As an example, the oxide layer can have a density equal to or greater than 2.0 g/cm$^3$, such as in a range from about 2.0 g/cm$^3$ to about 5.0 g/cm$^3$.

Dielectric caps 86 are formed on the buffer layers 84. To form the dielectric caps 86, a cap dielectric layer can be deposited in the remaining portions of the openings above the buffer layers 84 and on the top surface of the ILD0 60. The cap dielectric layer may comprise silicon nitride, silicon carbon nitride, or the like, formed using CVD, PECVD, or the like. The cap dielectric layer can then be planarized, such as by CMP, to form top surfaces co-planar with the top surface of the ILD0 60 thereby forming the dielectric caps.

Figure 8:
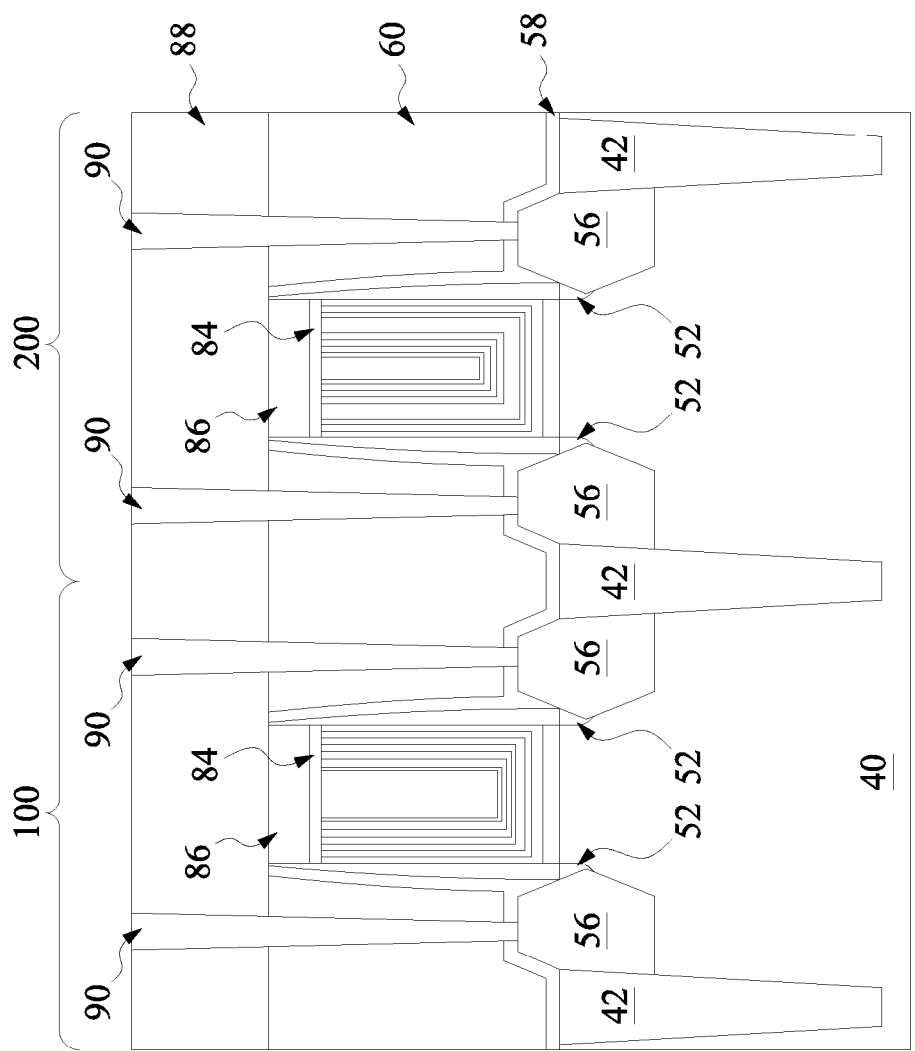

In FIG. 8, an upper ILD (ILD1) 88 is deposited over the ILD0 60 and the dielectric caps 86, and contacts 90 are formed through the ILD1 88, ILD0 60, and ESL 58 to the epitaxial source/drain regions 56. ILD1 88 is formed of a dielectric material such as PSG, BSG, BPSG, USG, or the like, and may be deposited by any suitable method, such as CVD and PECVD. Openings for contacts 90 are formed through the ILD1 88, ILD0 60, and ESL 58. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a top surface of the ILD1 88. The remaining liner and conductive material form contacts 90 in the openings. An anneal process may be performed to form a silicide at the interface between the epitaxial source/drain regions 56 and the contacts 90, respectively.

FIG. 8 illustrates a first device in the first region 100, which may be an n-type FET. The first device may have a tuned threshold voltage due to the metals 78 and 82 and the layers 64, 66, 68, 74, 76, and 80 included in the gate structure. FIG. 8 also illustrates a second device in the second region 200, which may be a p-type FET. The second device may have a tuned threshold voltage due to the metals 78 and 82 and the layers 64, 66, 68, 70, 74, 76, and 80 included in the gate structure.

Although not explicitly shown, a person having ordinary skill in the art will readily understand that further processing steps may be performed on the structure in FIG. 8. For example, various Inter-Metal Dielectrics (IMD) and their corresponding metallizations may be formed over ILD1 88.

Figure 9:
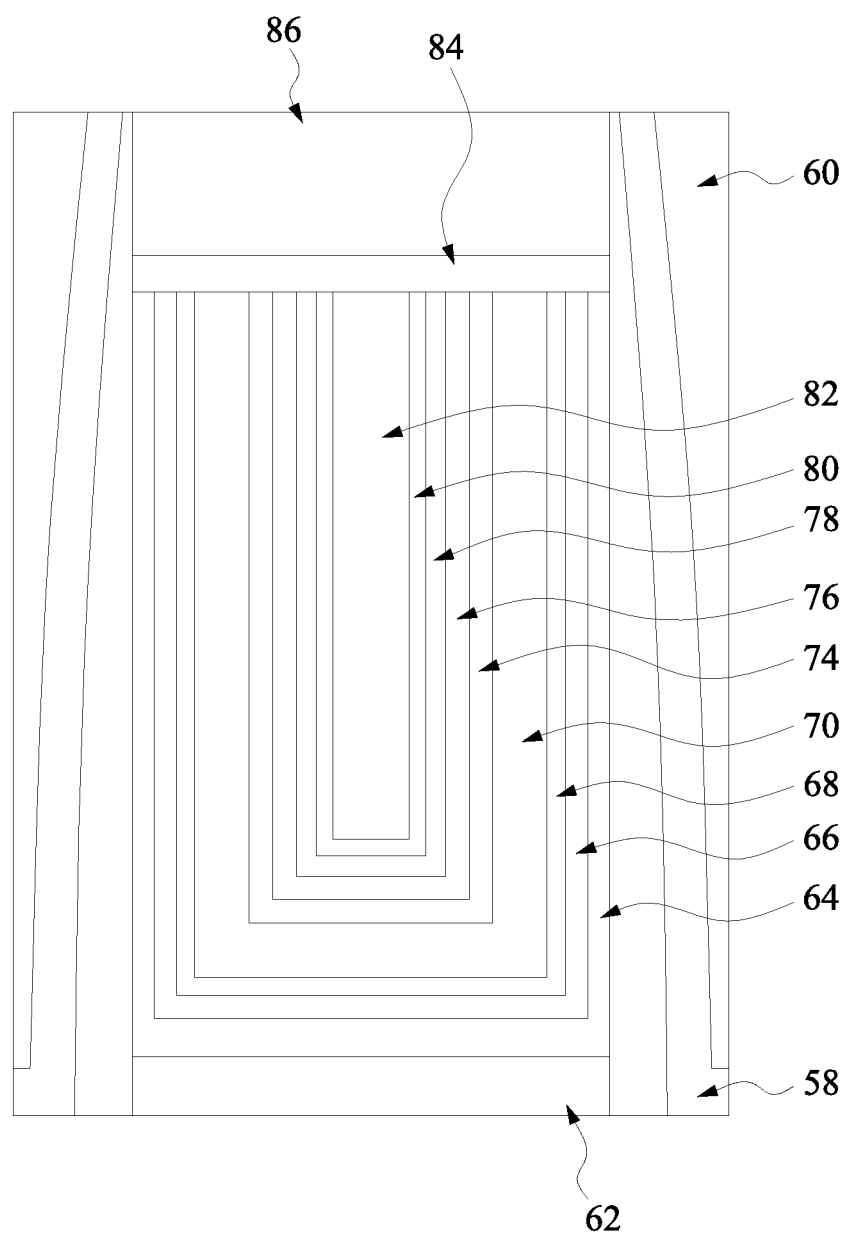
FIG. 9 is an enlarged view of a gate structure of a FET in accordance with some embodiments.

FIG. 9 is an enlarged view of the gate structure formed in the second region 200, which is shown to clarify the layers formed therein. The gate structure in the first region 100 has a similar cross section, except without the first work function tuning layer 70 previously discussed.

Some embodiments may achieve advantages. By forming an adhesion layer between two metals in a gate structure, adhesion between the metals can be improved. By forming a buffer layer, such as an oxide layer, on the gate structure as described, adhesion between, for example, the metal and a subsequent dielectric layer, such as a dielectric cap, may be improved. This improved adhesion can reduce diffusion of the conductive material and delamination.

An embodiment is a method. The method includes forming a first source/drain region and a second source/drain region in a substrate, and forming a gate structure between the first source/drain region and the second source/drain region and over the substrate. The gate structure includes a gate dielectric layer over the substrate, a work function tuning layer over the gate dielectric layer, a first metal over the work function tuning layer, an adhesion layer over the first metal, and a second metal over the adhesion layer. The second metal is different from the first metal.

Another embodiment is a method. The method comprises forming a first source/drain region and a second source/drain region in a substrate and forming an inter-layer dielectric over the substrate. An opening is through the inter-layer dielectric to the substrate, and the opening is between the first source/drain region and the second source/drain region. The method further comprises forming a gate dielectric layer in the opening and over the substrate; forming a work function tuning layer in the opening and over the gate dielectric layer; forming a first metal in the opening and over the work function tuning layer; forming a second metal in the opening and over the first metal; and forming an adhesion layer between the first metal and the second metal. The second metal is different from the first metal.

A further embodiment is a structure. The structure comprises a first source/drain region and a second source/drain region in a substrate, a gate structure on the substrate and between the first source/drain region and the second source/drain region, and an inter-layer dielectric over the substrate and around the gate structure. The gate structure comprises a gate dielectric layer over the substrate, a work function tuning layer over the gate dielectric layer, a first metal over the work function tuning layer, an adhesion layer over the first metal, and a second metal over the adhesion layer. The second metal is different from the first metal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first source/drain region and a second source/drain region in a substrate; and
   forming a gate structure between the first source/drain region and the second source/drain region and over the substrate, wherein forming the gate structure comprising:
   depositing a gate dielectric layer over the substrate,
   depositing a work function tuning layer over the gate dielectric layer,
   depositing a first metal over the work function tuning layer,
   forming an adhesion layer over the first metal, wherein forming the adhesion layer comprises oxidizing the first metal, and
   depositing a second metal over the adhesion layer, the second metal being different from the first metal.

2. The method of claim 1, wherein the adhesion layer comprises a first sub-layer of an oxide of the first metal and a second sub-layer of an oxide of the second metal.

3. The method of claim 1, wherein the adhesion layer is an oxide of a mixture of the first metal and the second metal.

4. The method of claim 1, wherein forming the gate structure comprises depositing, in a chamber, the first metal over the work function tuning layer, wherein oxidizing the first metal comprises: after depositing the first metal, allowing a natural environment in the chamber, and wherein the method further comprises:
after allowing the natural environment in the chamber, depositing, in the chamber, the second metal over the first metal, wherein the adhesion layer comprises an oxide formed at least in part by allowing the natural environment in the chamber.

5. The method of claim 1, wherein oxidizing the first metal comprises after depositing the first metal, exposing the first metal to an oxygen-containing plasma, and wherein the method further comprises:
after exposing the first metal to the oxygen-containing plasma, depositing the second metal over the first metal, wherein the adhesion layer comprises an oxide formed at least in part by exposing the first metal to the oxygen-containing plasma.

6. The method of claim 1 further comprising:
forming a buffer layer over the gate structure, the buffer layer comprising an oxide of the second metal; and
forming a dielectric cap over the buffer layer.

7. The method of claim 6 further comprising recessing the gate structure below a top surface of a dielectric layer to define an opening above the gate structure, wherein forming the buffer layer and the dielectric cap comprises forming the buffer layer and the dielectric cap in the opening.

8. The method of claim 1, wherein the first metal comprises cobalt and the second metal comprises aluminum.

9. The method of claim 1, wherein after depositing the second metal, a portion of the second metal diffuses into the adhesion layer.

10. The method of claim 1, wherein oxidizing the first metal comprises performing a thermal oxidation on the first metal.

11. A method comprising:
forming a first source/drain region and a second source/drain region in a substrate;
forming an inter-layer dielectric over the substrate, an opening being through the inter-layer dielectric to the substrate, the opening being between the first source/drain region and the second source/drain region;
forming a gate dielectric layer in the opening and over the substrate;
forming a work function tuning layer in the opening and over the gate dielectric layer;
forming a first metal in the opening and over the work function tuning layer;
forming a second metal in the opening and over the first metal, the second metal being different from the first metal; and
forming an adhesion layer between the first metal and the second metal, wherein forming the adhesion layer comprises annealing the first metal and the second metal to react to form an alloy of the first metal and the second metal.

12. The method of claim 11, wherein annealing the first metal and the second metal to react comprises annealing the first metal and the second metal at a temperature in a range from 200° C. to 500° C.

13. The method of claim 11 further comprising recessing the gate dielectric layer, the work function tuning layer, the first metal, the second metal, and the adhesion layer below a top surface of the inter-layer dielectric.

14. The method of claim 11 further comprising:
forming a buffer layer over the gate dielectric layer, the work function tuning layer, the first metal, the second metal, and the adhesion layer in the opening; and
forming a capping layer in the opening over the buffer layer.

15. The method of claim 14, wherein forming the buffer layer comprises oxidizing the second metal.

16. The method of claim 11, wherein a thickness of the alloy of the first metal and the second metal is in a range from 10 Å to 50 Å.

17. A method comprising:
forming a first source/drain region and a second source/drain region in a substrate;
forming an inter-layer dielectric over the substrate, a first opening being through the inter-layer dielectric to the substrate, the first opening being between the first source/drain region and the second source/drain region;
forming a gate dielectric layer in the first opening and over the substrate;
forming a first work function tuning layer in the first opening and over the gate dielectric layer;
forming a first metal in the first opening and over the first work function tuning layer;
forming a second metal in the first opening and over the first metal, the second metal being different from the first metal; and
forming an adhesion layer between the first metal and the second metal, wherein the adhesion layer comprises at least the first metal, and wherein the adhesion layer comprises:
an oxide of the first metal and the second metal;
an oxide of the second metal over an oxide of the first metal; or
an alloy of the first metal and the second metal.

18. The method of claim 17 further comprising:
forming a third source/drain region and a fourth source/drain region in the substrate;
forming a second opening being through the inter-layer dielectric to the substrate between the third source/drain region and the fourth source/drain region;
after forming the first work function tuning layer, masking the first opening by forming a mask over the first work function tuning layer over the first opening, wherein the mask is patterned to expose the second opening;
while masking the first opening, forming a second work function tuning layer in the second opening over a portion of the first work function tuning layer in the second opening; and
after forming the second work function tuning layer, removing the mask.

19. The method of claim 17 further comprising:
recessing portions of the gate dielectric layer, the first work function tuning layer, the first metal, the second metal, and the adhesion layer so that top surfaces of the gate dielectric layer, the first work function tuning layer, the first metal, the second metal are below a top surface of the inter-layer dielectric;
forming a buffer oxide layer in the first opening by oxidizing top portions of the gate dielectric layer, the first work function tuning layer, the first metal, the second metal in the first opening; and
forming a dielectric cap in the first opening and over the buffer oxide layer.

20. The method of claim 17, wherein the first metal comprises cobalt and the second metal comprises aluminum.

\* \* \* \* \*